(12) United States Patent
Hu et al.

(10) Patent No.: US 11,049,873 B2
(45) Date of Patent: Jun. 29, 2021

(54) EPITAXIAL MONOCRYSTALLINE CHANNEL FOR STORAGE TRANSISTORS IN 3-DIMENSIONAL MEMORY STRUCTURES AND METHODS FOR FORMATION THEREOF

(71) Applicant: SUNRISE MEMORY CORPORATION, Fremont, CA (US)

(72) Inventors: Chenming Hu, Oakland, CA (US); Wu-Yi Henry Chien, San Jose, CA (US); Eli Harari, Saratoga, CA (US)

(73) Assignee: SUNRISE MEMORY CORPORATION, Fremont, CA (US)

( * ) Notice: Subject to any disclaimer, the term of this patent is extended or adjusted under 35 U.S.C. 154(b) by 1 day.

(21) Appl. No.: 16/578,970

(22) Filed: Sep. 23, 2019

(65) Prior Publication Data

US 2020/0098789 A1 Mar. 26, 2020

Related U.S. Application Data

(60) Provisional application No. 62/735,662, filed on Sep. 24, 2018.

(51) Int. Cl.
| | |
|---|---|
| *H01L 27/11582* | (2017.01) |
| *H01L 27/11568* | (2017.01) |
| *H01L 21/02* | (2006.01) |
| *H01L 21/28* | (2006.01) |

(52) U.S. Cl.
CPC .. *H01L 27/11582* (2013.01); *H01L 21/02532* (2013.01); *H01L 21/02573* (2013.01); *H01L 21/02598* (2013.01); *H01L 21/02636* (2013.01); *H01L 21/02661* (2013.01); *H01L 27/11568* (2013.01); *H01L 29/40117* (2019.08)

(58) Field of Classification Search
CPC combination set(s) only.
See application file for complete search history.

(56) References Cited

U.S. PATENT DOCUMENTS

| | | | | |
|---|---|---|---|---|
| 8,440,542 | B2 * | 5/2013 | Sekar | H01L 29/66795 438/455 |
| 9,780,100 | B1 * | 10/2017 | Balakrishnan | H01L 28/00 |
| 10,522,225 | B1 * | 12/2019 | Or-Bach | H01L 29/42344 |
| 2006/0060856 | A1 * | 3/2006 | Anderson | H01L 21/823814 257/66 |
| 2013/0307513 | A1 * | 11/2013 | Then | H01L 21/02636 323/311 |
| 2015/0279852 | A1 * | 10/2015 | Mizutani | H01L 27/11524 257/315 |
| 2016/0111434 | A1 * | 4/2016 | Pachamuthu | H01L 21/02595 257/314 |
| 2019/0252260 | A1 * | 8/2019 | Reznicek | H01L 21/02667 |
| 2020/0013800 | A1 * | 1/2020 | Or-Bach | H01L 29/7923 |
| 2020/0194416 | A1 * | 6/2020 | Or-Bach | H01L 27/11529 |
| 2020/0343260 | A1 * | 10/2020 | Wang | G11C 11/4087 |

* cited by examiner

*Primary Examiner* — Mamadou L Diallo
(74) *Attorney, Agent, or Firm* — Edward C. Kwok; VLP Law Group, LLP

(57) ABSTRACT

A thin-film storage transistor includes (a) first and second semiconductor regions comprising polysilicon of a first conductivity; and (b) a channel region between the first and second semiconductor regions, the channel region comprising single-crystal epitaxial grown silicon, and wherein the thin-film storage transistor is formed above a monocrystalline semiconductor substrate.

12 Claims, 9 Drawing Sheets

FIG. 2iii

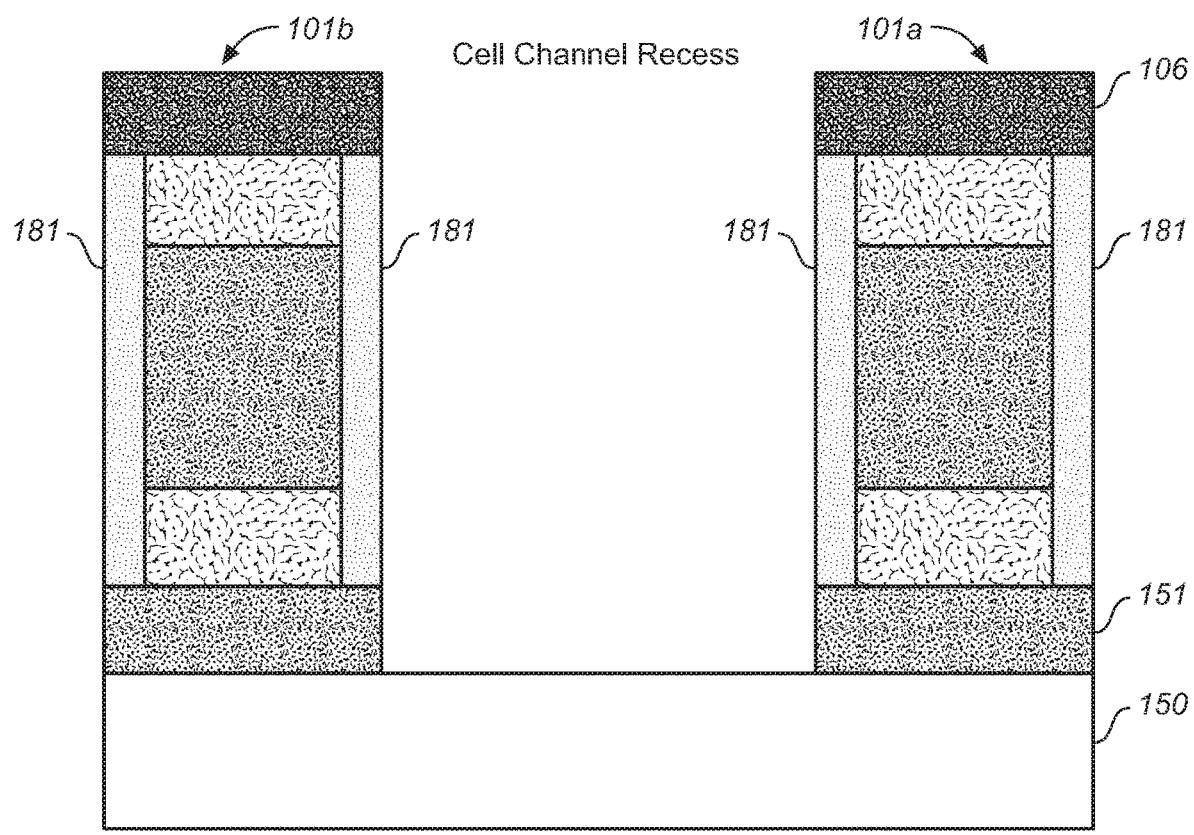
FIG. 2vii

FIG. 3iii

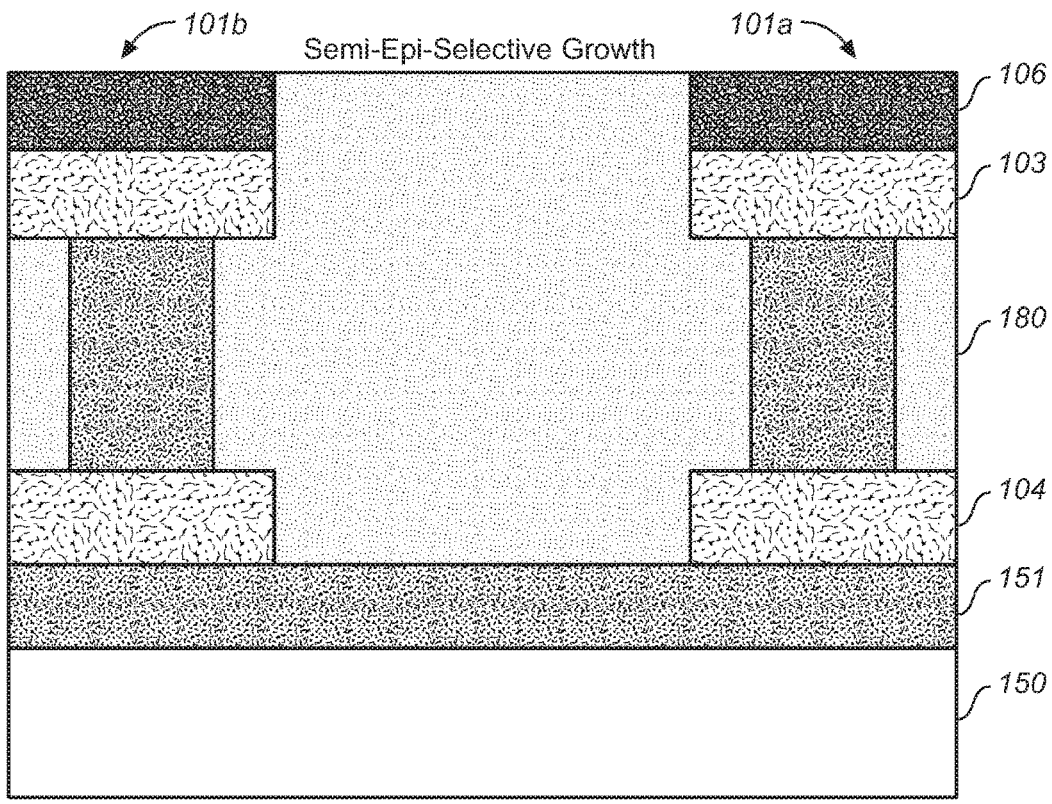
FIG. 3vii
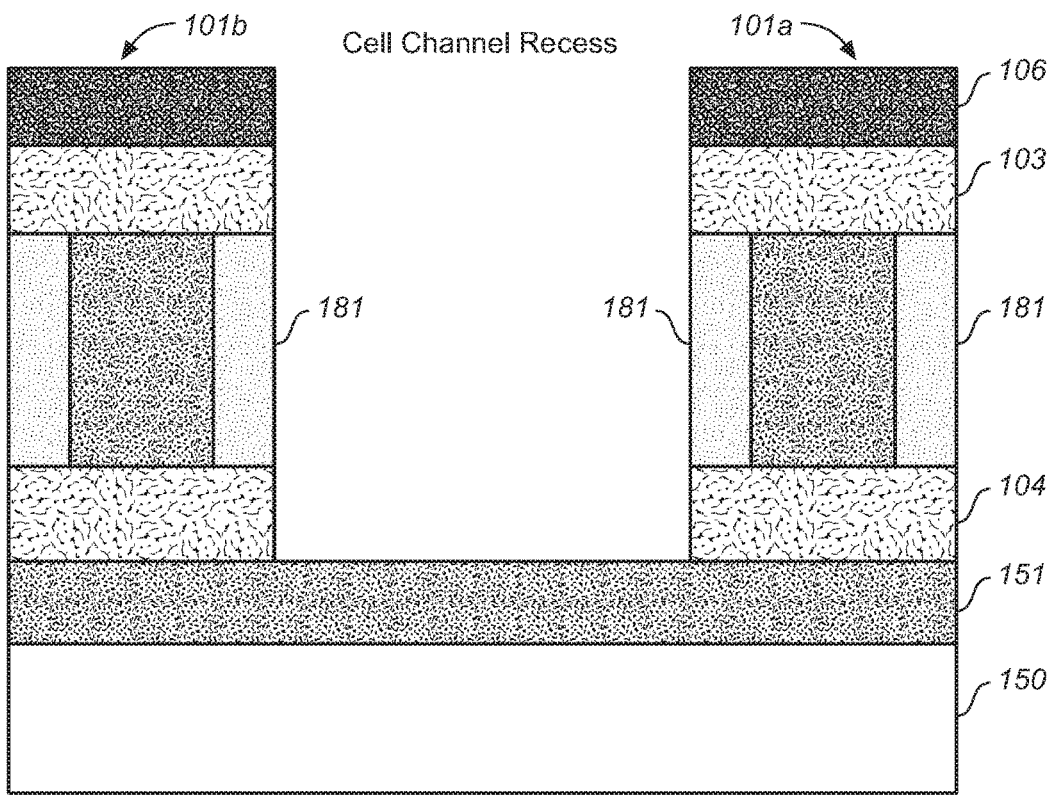
FIG. 3viii

EPITAXIAL MONOCRYSTALLINE CHANNEL FOR STORAGE TRANSISTORS IN 3-DIMENSIONAL MEMORY STRUCTURES AND METHODS FOR FORMATION THEREOF

CROSS REFERENCE TO RELATED APPLICATIONS

The present application is related to and claims priority of U.S. provisional patent application ("Provisional Application"), Ser. No. 62/735,662, entitled "Epitaxial Monocrystalline Channel for Storage Transistors in 3-Dimensional Memory Structures and Methods for Formation Thereof," filed on Sep. 24, 2018.

The present application is also related to U.S. patent application ("Copending Application"), Ser. No. 16/012,731, entitled "3-Dimensional NOR Memory Array Architecture and Methods for Fabrication Thereof," filed Jun. 19, 2018. The disclosures of the Copending Application and the Provisional Application are hereby incorporated by reference in their entireties.

BACKGROUND OF THE INVENTION

Field of the Invention

The present invention relates to memory structures, formed on top of a monocrystalline semiconductor substrate, that are organized as arrays of thin-film storage transistors. In particular, the present invention relates to providing a single-crystal silicon channel region for such storage transistors.

Discussion of the Related Art

The Copending Application discloses 3-dimensional memory structures, formed on top of a monocrystalline semiconductor substrates, that are organized as arrays of NOR memory strings. In this context, the term "NOR memory string" refers to a group of thin-film storage transistors sharing common source and drain regions. FIG. 1 illustrates, in cross section, memory structure 30 including an array of NOR memory strings. As shown in FIG. 1, memory structure 30 is formed on a semiconductor (e.g., epitaxial monocrystalline silicon) substrate 150. A suitable semiconductor substrate may be, for example, a semiconductor wafer that is used for fabrication of electronic circuits, as known to those of ordinary skill in the art.

Semiconductor substrate 150 may have fabricated thereon and therein various circuit elements (e.g., CMOS transistor 10) interconnected by conductors 22 (e.g., copper) in conventional interconnect layers through contacts or vias 16. These circuit elements are first fabricated on the semiconductor substrate using conventional techniques before forming memory structure 30. The interconnect layers—typically embedded in a dielectric layer—may include conductors intended for supporting operations of memory arrays in memory structure 30, which is to be formed over the interconnect layers. For example, interconnect layer 24 provides conductors ("global word lines 24") that are intended to connect conductors 32 (e.g., heavily-doped polysilicon) serving as word lines that address storage transistors in memory structure 30. Conductors 32 are referred to as "local word lines" in this detailed description.

As shown in FIG. 1, memory structure 30 includes numerous stacks of "active strips" (e.g., active stacks 101a, 101b and 101c). For example, FIG. 1 shows stacks 101a, 101b and 101c each including 4 active strips isolated from each other by isolation layers 107. FIG. 1 is a cross section through the active strips, which extend lengthwise into and out of the plane of cross section. In this context, an active strip includes drain layer 104, source layer 103, body layer 102, and channel layers 108. (Channel layers 108 are provided on both sides of body layer 102.) In some implementations, drain layer 104 and source layer 103 are both $n^+$ polysilicon, channel layers 108 are each $p^-$ polysilicon and body layer 102 is a $p^+$ polysilicon. In some implementations, rather than body layer 102, a dielectric layer may be used. Also shown in the active strips of FIG. 1 are conductive layers 105$t$ and 105$b$, adjacent respectively to source layer 103 and drain layer 104, for reducing resistivity along the lengths of source layer 103 and drain layer 104. Along the each side of each slack of active strops (and, hence, along each side of each active strip) is provided a charge-trapping layer 107 and numerous local word lines 32. In FIG. 1, local words line 32 are conductive columns arranged along both sides of a stack of active strips. A storage transistor is constituted by a local word line, a portion of channel layer 108, the portion of charge-trapping layer 107 therebetween, and source and drain layers 103 and 104. Drain layer 104 and source layer 103 are shared by the numerous storage transistors formed along an active strip. Adjacent storage transistors along an active strip sharing common source and drain layers form a NOR memory string. (Turning on any storage transistor in the NOR memory string results in a conducting transistor current between the common source and drain layers.)

Unlike a channel region of a transistor formed in the monocrystalline semiconductor substrate, the polysilicon channel region of the thin-film storage transistors in memory structure 30 has several disadvantages:

(a) low conducting transistor current because of low electron mobility in the polysilicon;
(b) high temperature sensitivity in the transistor currents due to grain boundaries in the polysilicon;
(c) high dopant diffusivity in polysilicon, which requires careful design to mitigate out-diffusion of dopants into channel layers 108 from source and drain layers 103 and 104;
(d) high leakage currents in the bipolar junctions;
(e) polysilicon grain boundaries are deleterious to forming high-quality tunneling oxide in charge-trapping layer 107 difficult; and
(f) polysilicon grain boundaries introduce variability in the threshold voltages of the thin-film storage transistors.

Incorporating monocrystalline silicon in a memory structure for NAND type memory strings have been disclosed, for example, in the article, entitled "First Demonstration of Monocrystalline Silicon Macroni Channel for 3-D NAND Memory Devices," published in *Digest of Technical Papers, 2018 Symposium on VLSI Technology,* pp. 203-204. The article discloses a process that first deposits a sacrificial amorphous silicon dummy channel, which is to be removed by chlorine gas in a carefully tuned isotropic etch prior to selective epitaxial silicon growth to form the ultimate channel. Removing the amorphous dummy channel must be carried out without significant undercut in features that provide mechanical integrity. Such precise tuning is particularly difficult in processes where features with high aspect ratios are present.

Processes for forming monocrystalline silicon features using selective silicon epitaxy are disclosed, for example, in (a) the article, entitled "Low Temperature Selective Silicon Epitaxy by Ultra-High Vacuum Rapid Thermal Chemical Vapor Deposition Using $Si_2H_6$, $H_2$ and $Cl_2$," by K. Violette et al., *Appl. Phys. Lett.* 68, 66 (1996); (b) the Ph.D. dissertation, entitled "Silicon-Based Epitaxy by Chemical Vapor Deposition Using Novel Precursor Neopentasilane," by Keith H. Chung, submitted in 2010 to Princeton University; and (c) the technical report, entitled "Modeling of Growth Rates of Selective Epitaxial Growth (SEG) and Epitaxial Lateral Overgrowth (ELO) of Silicon in the $Si_2H_6$—$H_2$—$Cl_2$ System," by P. Kongretira et al., School of Electrical Engineering, Purdue University, October 1994.

SUMMARY

According to one embodiment of the present invention, a thin-film storage transistor includes (a) first and second semiconductor regions comprising polysilicon of a first conductivity; and (b) a channel region between the first and second semiconductor regions, the channel region comprising single-crystal epitaxial grown silicon, and wherein the thin-film storage transistor is formed above a semiconductor substrate.

According to one embodiment of the present invention, the thin-film storage transistors may be formed using a process which comprises: (i) providing a semiconductor substrate having a planar surface, the semiconductor substrate comprising monocrystalline silicon at the planar surface; (ii) providing an oxide isolation layer on top of the planar surface of the semiconductor substrate; (iii) forming a plurality of active layers, each active layer being isolated by a nitride isolation layer from its adjacent active layer or adjacent active layers, each active layer comprising (a) first and second semiconductor layers of a first conductivity; and (b) a dielectric layer between the first and second semiconductor layers; (iv) creating deep trenches in the plurality of active layers, to create a plurality of stacks of active strips separated by the deep trenches, each active strip being a portion of one of the active layer remaining in the stack of active strips as a result of creating the deep trenches; (v0 recessing the dielectric layer in each active strip to form one or more cavities in the active strip; (vi) in an evacuated reaction chamber, removing any native oxide on any exposed surface of the semiconductor substrate or the first and second semiconductor layers of the active strips; (vii) without removing the semiconductor substrate from the evacuated reaction chamber, filling the deep trenches and the cavities with single-crystal silicon using a selective epitaxial silicon growth technique; and (viii) removing the single-crystalline silicon from the deep trenches, thereby leaving single-crystalline silicon in the cavities to serve as channel regions of storage transistors to be subsequently formed.

The present invention is better understood upon consideration of the detailed description below in conjunction with the drawings.

BRIEF DESCRIPTION OF THE DRAWINGS

To simplify the detailed description, like elements in the figures are assigned like reference numerals.

DETAILED DESCRIPTION OF THE PREFERRED EMBODIMENTS

The present invention provides storage transistors with single-crystal semiconductor channel regions by either (a) epitaxial growth from an underlying semiconductor substrate or (b) initial epitaxial growth from the grain boundaries of N+ poly source and drain regions.

This detailed description illustrates processes for forming such channel regions using memory structures such as those described above with respect to FIG. 1. However, for clarity of presentation, only one active strip is shown for each stack of active strips. One of ordinary skill in the art would understand that the processes illustrated herein are applicable for a stack of active strips with any suitable number of active strips.

FIGS. 2(*i*) to 2(*vii*) illustrate providing single-crystal silicon channel regions in storage transistors of a memory structure by selective epitaxial growth of silicon from a monocrystalline substrate, according to one embodiment of the present invention.

Figure 1:
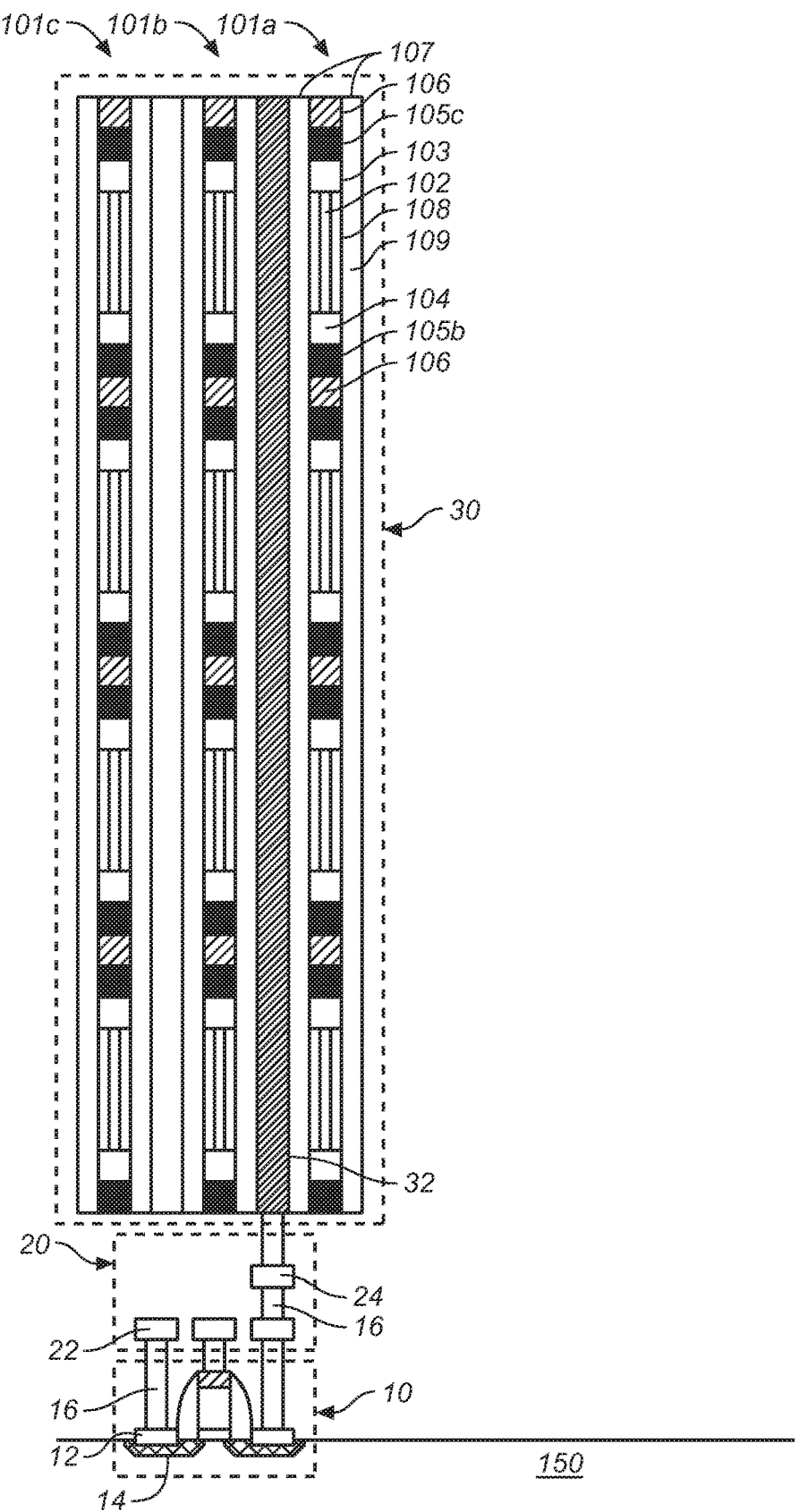
FIG. 1 illustrates, in cross section, memory structure 30 including an array of NOR memory strings.
Figure 2I:
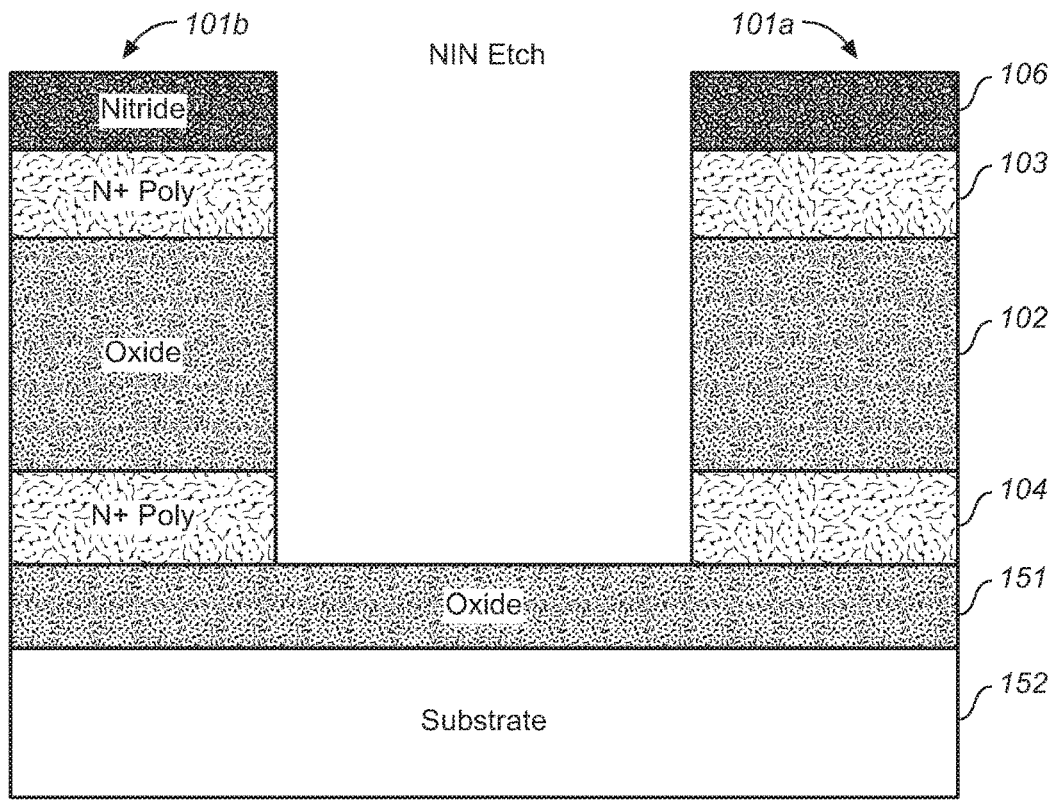
FIGS. 2(*i*), 2(*ii*), 2(*iii*), 2(*iv*), 2(*v*), 2(*vi*) and 2(*vii*) illustrate providing single-crystal silicon channel regions in storage transistors of a memory structure by selective epitaxial growth of silicon from a monocrystalline substrate, according to one embodiment of the present invention.
Figure 2I:
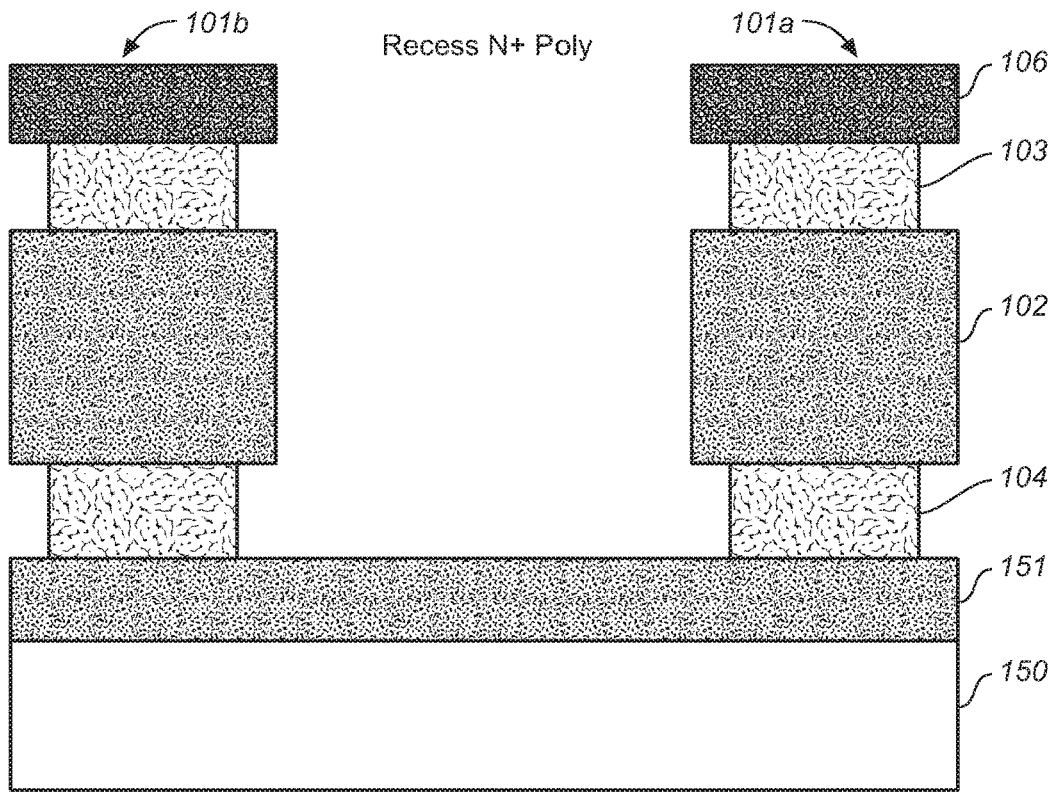
Figure 2I:
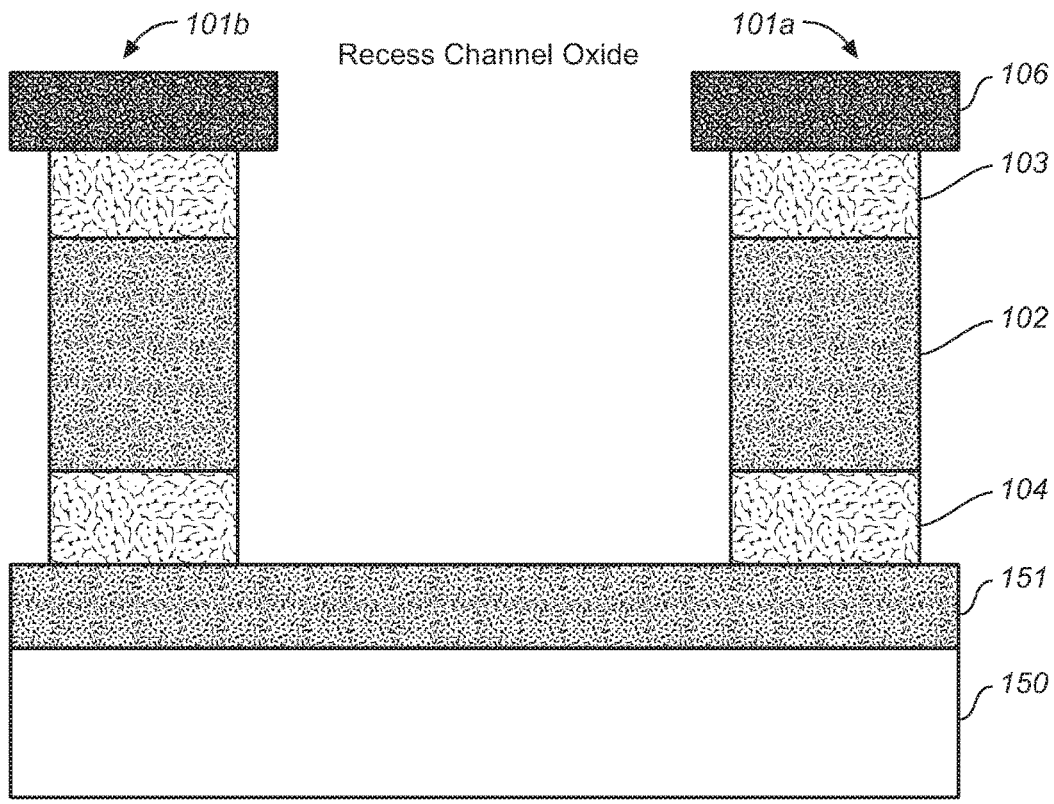
Figure 2I:
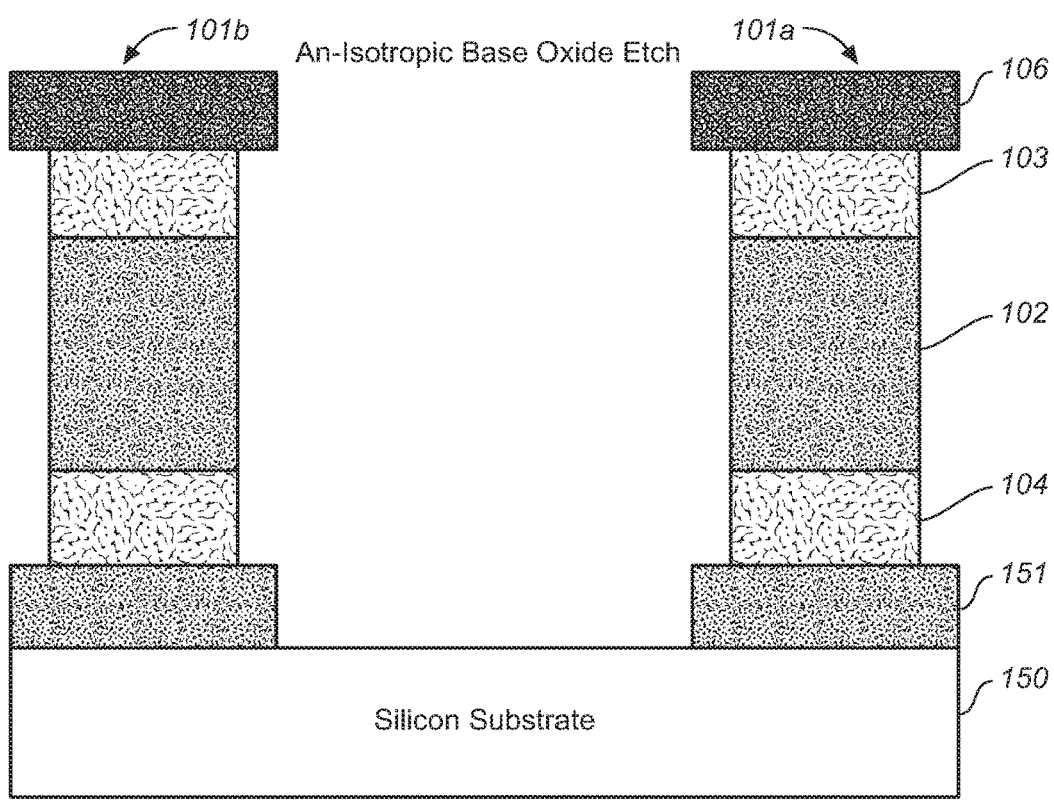
Figure 2V:
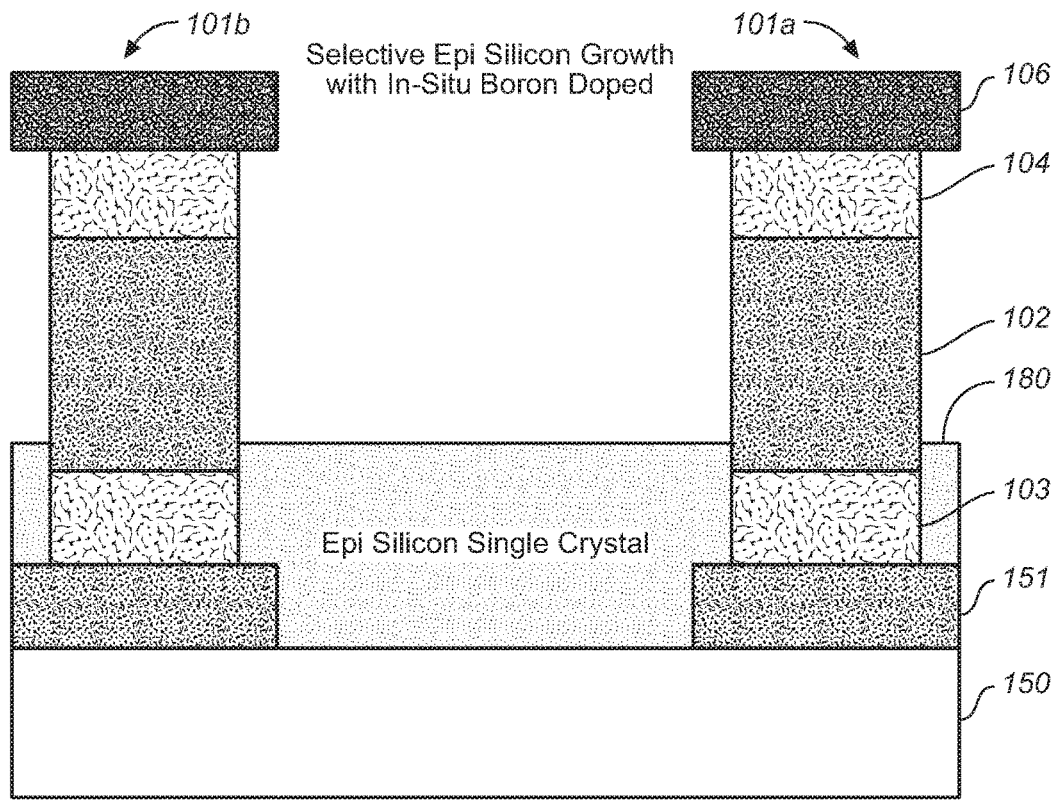
Figure 2V:
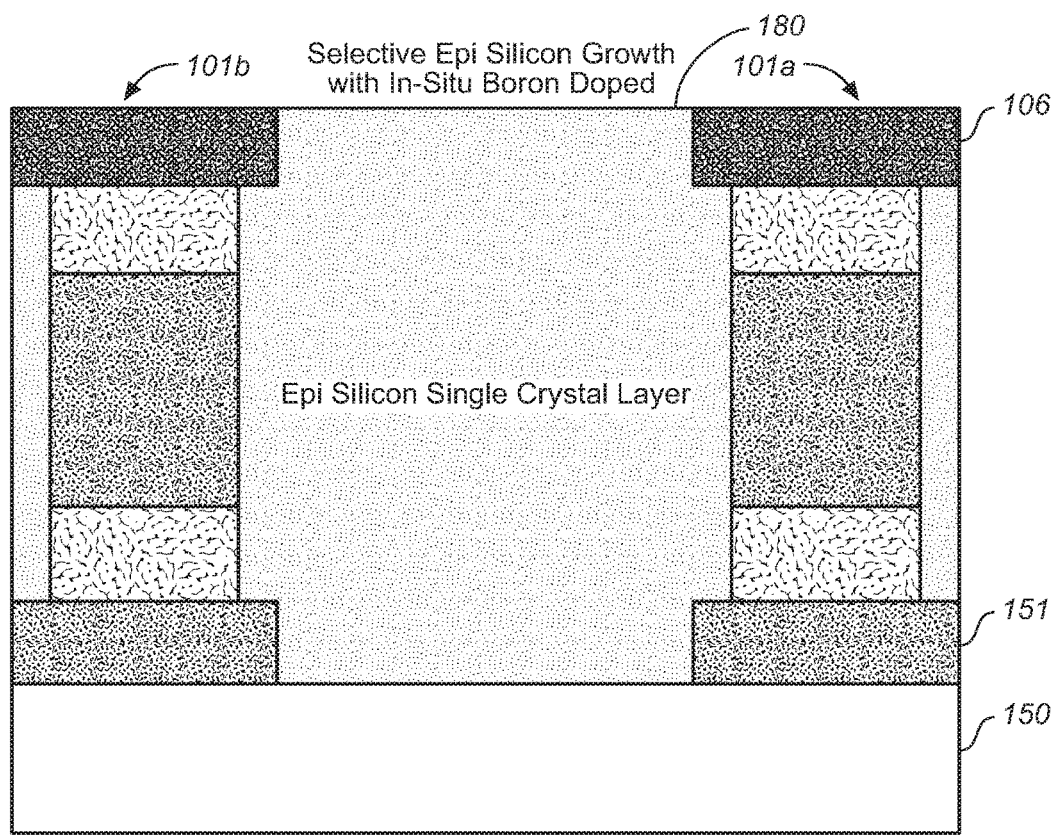
Figure 3I:
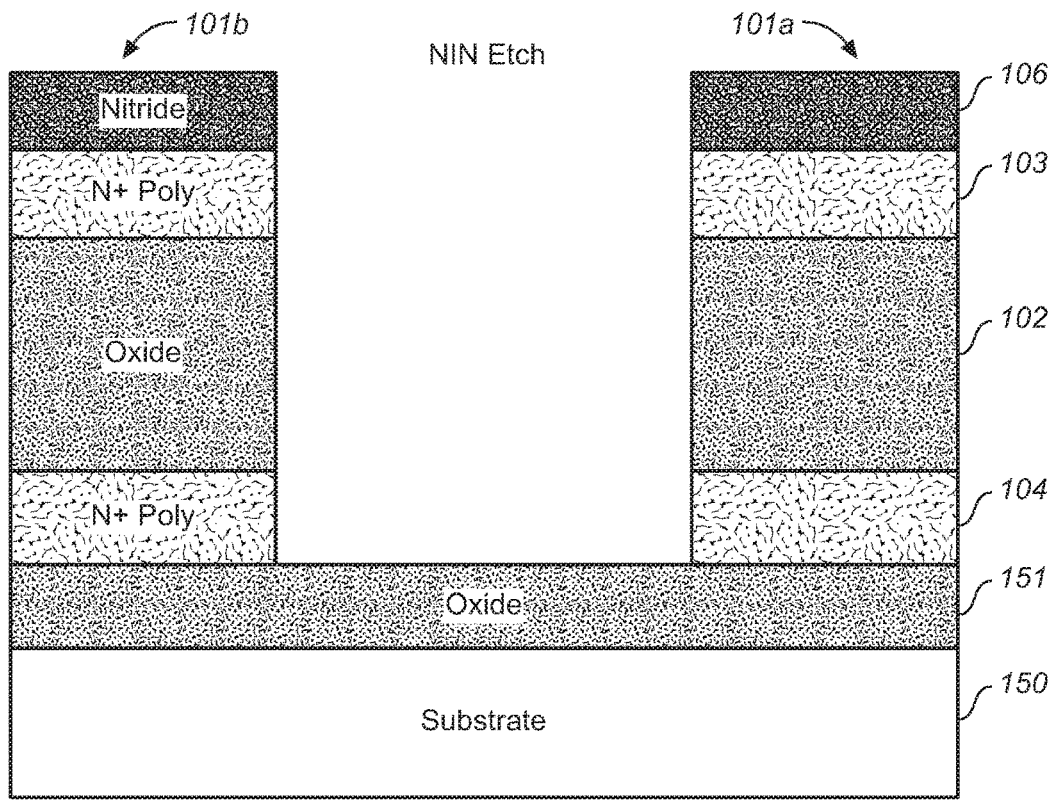
FIGS. 3(*i*), 3(*ii*), 3(*iii*), 3(*iv*), 3(*v*), 3(*vi*), 3(*vii*) and 3(*viii*) illustrate providing single-crystal silicon channels in a memory structure by selective epitaxial growth of silicon from either a crystalline substrate or polysilicon grain boundaries, according to alternative embodiments of the present invention.
Figure 3I:
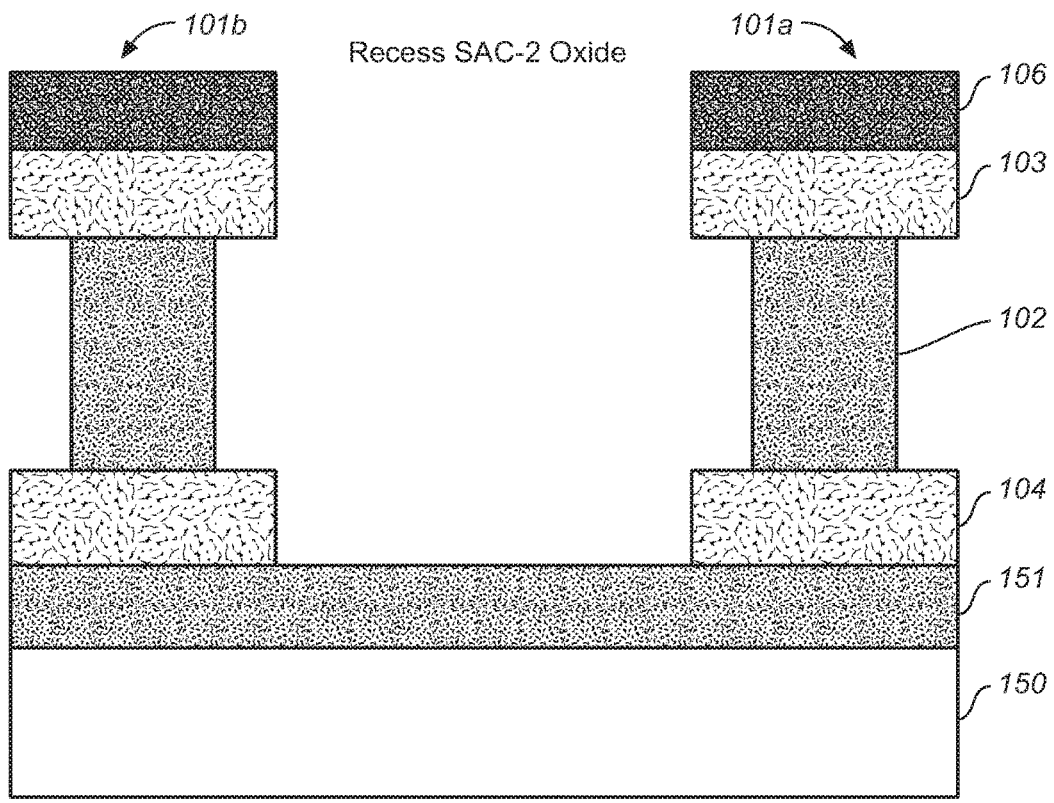
Figure 3I:
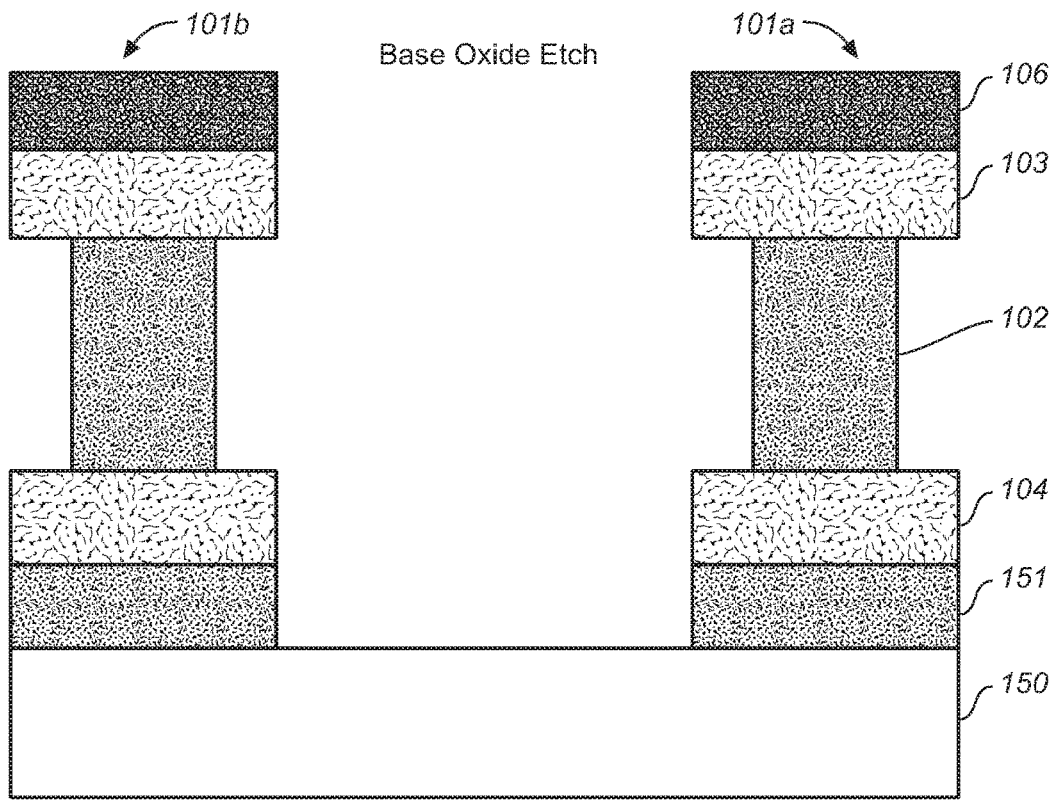
Figure 3I:
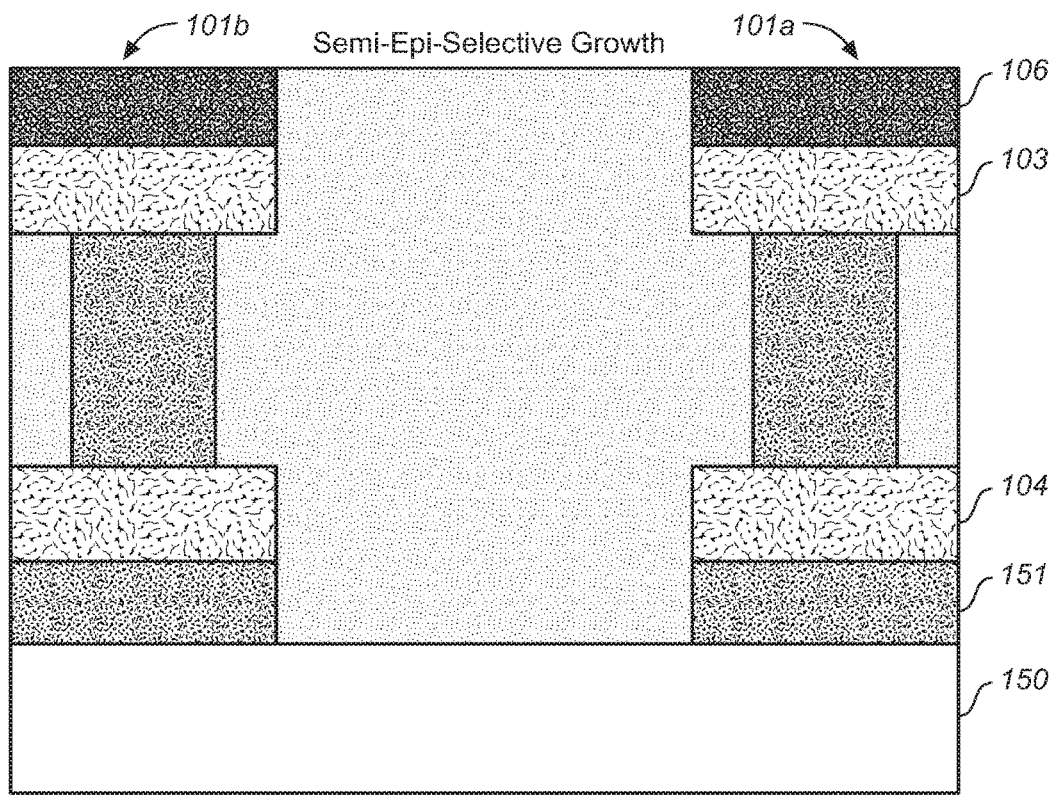
Figure 3V:
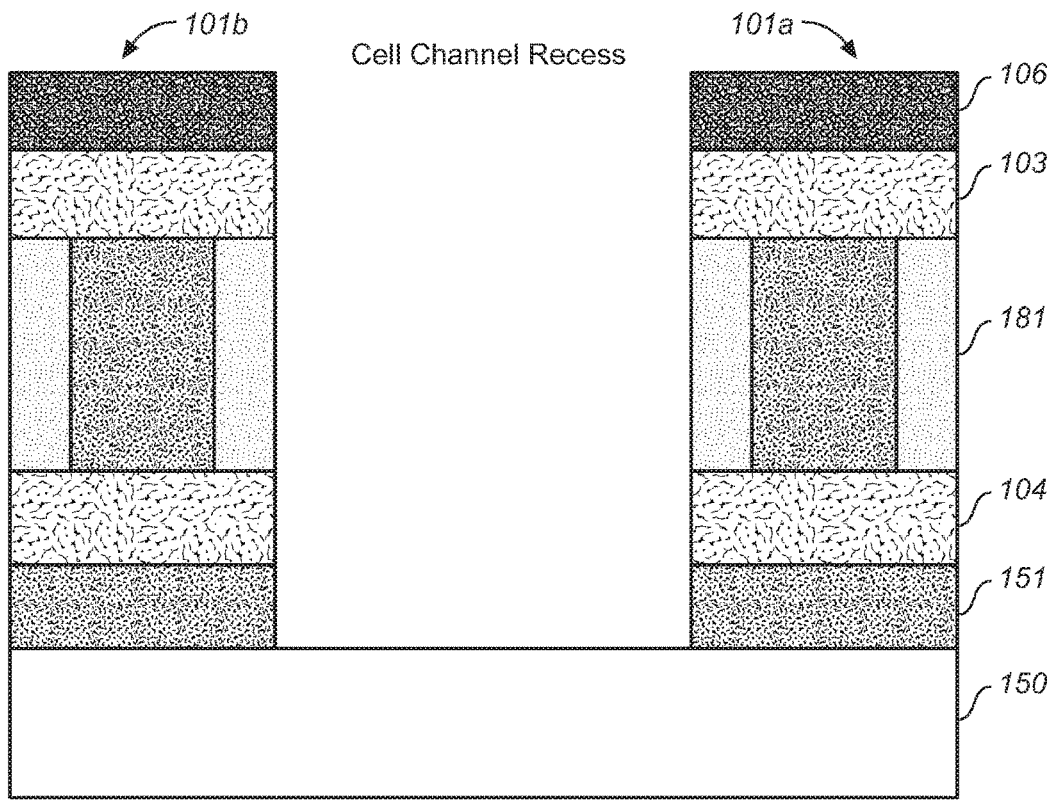
Figure 3V:
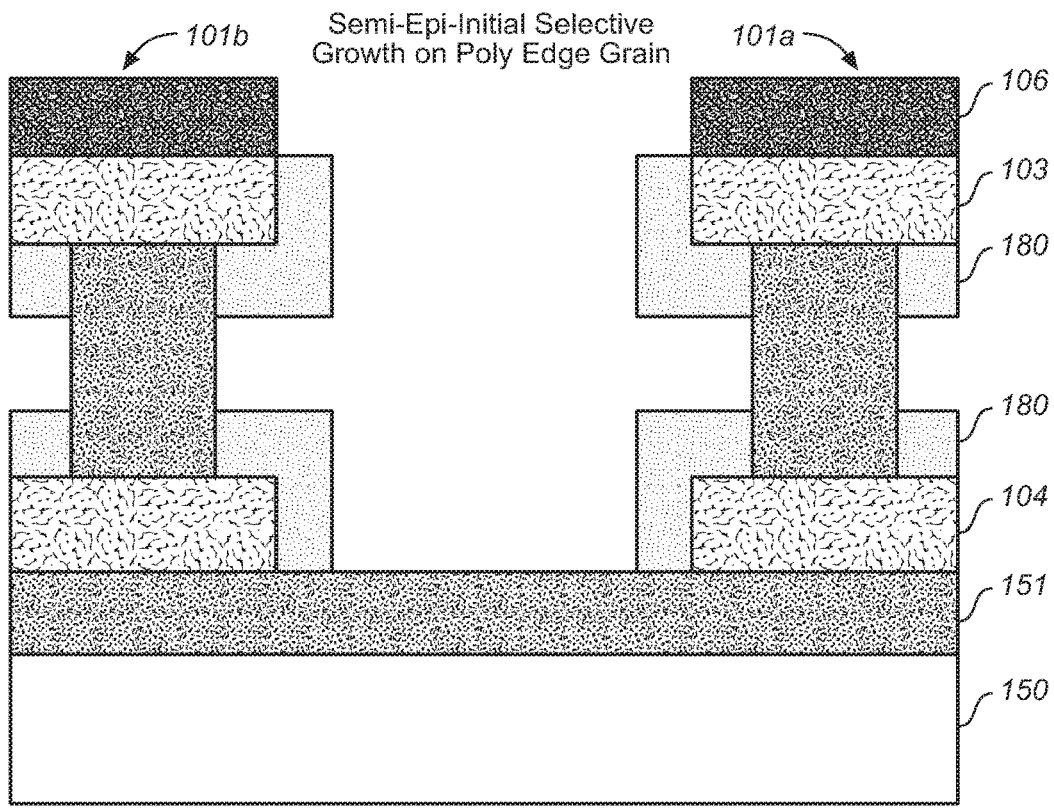

Initially, various circuit elements and interconnect layers are formed in isolation layer 151 on top of a planar surface of semiconductor substrate 150 (e.g. silicon), as described with respect to FIG. 1 above. Thereafter, multiple active layers are deposited on top of isolation layer 151. These active layers include nitride isolation layer 106, source layer 103, dielectric layer 102 (e.g., a silicon oxide layer), and drain layer 104, Again, for the purpose of clarity of presentation, some features not essential to the description below (e.g., conductive layers 105*t* and 105*b*) have been omitted from the figures. Stacks of active strips (e.g., those illustrated in FIG. 1 by stacks 101*a*, 101*b* and 101*c*) are then formed by etching deep trenches into the active layers ("NIN etch"). The resulting structure is shown in FIG. 2(*i*).

Thereafter, source layer 103 and drain layer 104, both consisting primarily of p$^+$ polysilicon are recessed using a selective etch, which leaves dielectric layer 102 substantially intact. The resulting memory structure is illustrated by FIG. 2(*ii*). Dielectric layer 102 may also be recessed using a selective etch. The resulting memory structure is shown in FIG. 2(*iii*). A portion of isolation layer 151 is then removed to expose a portion of semiconductor substrate 150, which provides a monocrystalline substrate suitable for epitaxial growth of silicon (FIG. 2(*iv*)).

To prepare the exposed monocrystalline surface of semiconductor substrate 150 for epitaxial growth of silicon, the semiconductor wafer is placed in an evacuated reaction chamber for gaseous reactions. Examples of such reaction chambers include those suitable for low-pressure chemical vapor deposition (LPCVD), reactive ion etching (RIE) and the like, known to those of ordinary skill in the art. The exposed monocrystalline surface of semiconductor substrate 150 may be cleaned, for example, using chlorine, to remove in situ any native oxide on the exposed areas of the semiconductor substrate. This cleaning step may require exposure to a temperature of 800° C. or higher. However, the step may be carried out over a very brief period of time, and thus can be accommodated in the junction thermal budget for forming the memory structure.

Thereafter, without removing the semiconductor wafer from the evacuated reaction chamber, selective epitaxial growth of silicon may be carried out, initiated from the cleaned monocrystalline surface of semiconductor substrate 150. FIG. 2(*v*) shows an intermediate structure with single-crystal silicon 180 during the selective epitaxial growth. Selective epitaxial growth of silicon may be carried out at a relatively low temperature (e.g., 600° C.). In addition, in situ boron doping may be carried out simultaneously, so that the resulting single-crystal silicon would have a p⁻ dopant concentration (e.g., $1.0\text{-}50\times10^{18}$ cm$^{-3}$). The selective epitaxial growth of silicon is complete when single-crystal silicon 180 completely fills the deep tranches between the stacks of active strips, as shown in FIG. 2(*vi*). A channel recess step may then anisotropically remove the single crystal silicon 180 from the deep trenches, leaving single-crystal silicon channel regions 181 in the recessed cavities of the active strips, as shown in FIG. 2(*vii*).

Other methods for providing single-crystal silicon channel regions for storage transistors in a memory structure are also possible. FIGS. 3(*i*) to 3(*viii*) illustrate providing single-crystal silicon channels in a memory structure by selective epitaxial growth of silicon from a monocrystalline substrate or from grain boundaries of polysilicon, according to alternative embodiments of the present invention.

FIG. 3(*i*) shows stacks 101*a* and 101*b* of active strips after the NIN etch cites deep trenches into the deposited active layers, as discussed above with respect to FIG. 2(*i*). According to an alternative embodiment of the present invention, rather than first recessing source layer 103 and drain layer 104, a selective etch of dielectric layer 102 (e.g., an isotropic silicon oxide etch) is carried out to first recess dielectric layer 102, as illustrated in FIG. 3(*ii*). Thereafter, a portion of isolation layer 151 is removed to expose a portion of the monocrystalline surface of semiconductor substrate 150 for initiation of epitaxial growth of silicon (FIG. 3(*iii*)). Having made a monocrystalline surface available, the semiconductor wafer may be removed to an evacuated reaction chamber for gaseous reactions, as discussed above with respect to the cleaning and the selective epitaxial growth of silicon steps above.

Without removing the semiconductor wafer from the evacuated reaction chamber, both the cleaning step and the selective epitaxial growth of silicon step are carried out. The selective epitaxial growth of silicon is complete when single-crystal silicon 180 completely fills the deep tranches between the stacks of active strips, as shown in FIG. 3(*iv*). A channel recess step may then anisotropically remove the single crystal silicon 180 from the deep trenches, leaving single-crystal silicon channel regions 181, as shown in FIG. 3(*v*).

Alternatively, after the isotropic oxide etching step of FIG. 3(*ii*) is carried out, a selective epitaxial growth of silicon may be carried out. Unlike the selective epitaxial growth of silicon discussed above, which are initiated from an exposed monocrystalline silicon surface, the selective epitaxial growth of silicon is initiated at the grain boundaries of the p⁺ polysilicon. The selective epitaxial growth of silicon is complete when single crystal silicon 180 completely fills the deep tranches between the stacks of active strips, as shown in FIG. 3(*vii*). A channel recess step may then anisotropically remove the single crystal silicon 180 from the deep trenches, leaving single crystal channel regions 181 181 in the recessed cavities of the active strips, as shown in FIG. 3(*viii*).

The single-crystal silicon channel regions in thin-film storage transistors, according to the embodiments of the present invention, provide the following advantages:
(a). in situ formation of clean source and drain junctions without deleterious effects from their native oxides;
(b) high electron mobility in the channel region;
(c) high-quality tunnel oxide in the charge-trapping layer may be formed;
(d) reduced out-diffusion from the source and drain layers into the channel regions;
(e) monocrystalline silicon channel region with desirable grain boundary characteristics; and
(f) reduced leakage current in the source and drain junctions.

The above detailed description is provided to illustrate specific embodiments of the present invention and is not intended to be limiting. Numerous modifications and variations within the scope of the present invention are possible. The present invention is set forth in the accompanying claims.

We claim:

1. A thin-film storage transistor, comprising:
   first and second semiconductor regions comprising polysilicon of a first conductivity; and
   a channel region abutting the first and second semiconductor regions, the channel region comprising single-crystal epitaxial grown silicon doped to a second conductivity opposite the first conductivity, and wherein the thin-film storage transistor is one of a plurality of thin-film storage transistors organized as a NOR memory string formed above a semiconductor substrate.

2. The thin-film storage transistor of claim 1, wherein the semiconductor substrate has a planar surface and wherein the NOR memory string is formed along an active strip which extends lengthwise along a direction parallel to the planar surface.

3. The thin-film storage transistor of claim 2, wherein the active strip comprises first and second semiconductor layers which provide the first and second semiconductor regions shared in common by the thin-film storage transistors of the NOR memory string.

4. A process, comprising the steps of:
   providing a semiconductor substrate having a planar surface, the semiconductor substrate comprising monocrystalline silicon at the planar surface;
   providing an oxide isolation layer on top of the planar surface of the semiconductor substrate;
   forming a plurality of active layers, each active layer being isolated by a dielectric isolation layer from its adjacent active layer or adjacent active layers, each active layer comprising (a) first and second semiconductor layers of a first conductivity; and (b) a dielectric layer between the first and second semiconductor layers;
   creating deep trenches in the plurality of active layers, to create a plurality of stacks of active strips separated by the deep trenches, each active strip being a portion of one of the active layer remaining in the stack of active strips as a result of creating the deep trenches;
   recessing the dielectric layer in each active strip to form one or more cavities in the active strip;
   in an evacuated reaction chamber, removing any native oxide on any exposed surface of the semiconductor substrate or the first and second semiconductor layers of the active strips;

without removing the semiconductor substrate from the evacuated reaction chamber, filling the deep trenches and the cavities with single-crystal silicon using a selective epitaxial silicon growth technique; and removing the single-crystalline silicon from the deep trenches, thereby leaving single-crystalline silicon in the cavities to serve as channel regions of storage transistors to be subsequently formed.

5. The process of claim 4, wherein the native oxide is removed via a chlorine cleaning step.

6. The process of claim 4, further comprising in situ-doping of the single-crystalline silicon simultaneously with the selective epitaxial silicon growth.

7. The process of claim 4, further comprising removing a portion of the oxide isolation layer so as to expose the monocrystalline silicon at a portion of the planar surface, thereby providing an initiation location for the selective epitaxial silicon growth.

8. The process of claim 4, wherein, the a selective epitaxial silicon growth is initiated at sites of polysilicon grain boundaries at the first and second semiconductor layers of the active strips.

9. The process of claim 4, further comprising, prior to removing the native oxide, recessing the first and semiconductor layers in the active strips.

10. The process of claim 4, further comprising:

providing on the sidewalls of the deep trenches charge-trapping material layers each having a tunneling oxide component layer opposite the cavities that have been filled by the single-crystalline silicon; and providing a plurality of conductive columns along the deep trenches between the charge-trapping material layers on the sidewalls.

11. The process of claim 4, wherein each active layer further comprises a conductive layer adjacent either the first semiconductor layer or the second semiconductor layer.

12. The process of claim 4, wherein the dielectric isolation layer comprises silicon nitride.

* * * * *